(12) United States Patent
Erickson et al.

(10) Patent No.: US 8,800,998 B2
(45) Date of Patent: Aug. 12, 2014

(54) SEMICONDUCTOR WAFER ISOLATED TRANSFER CHUCK

(75) Inventors: Andrew N. Erickson, Santa Barbara, CA (US); Jeffrey M. Markakis, Santa Barbara, CA (US); Anton L. Riley, Solvang, CA (US)

(73) Assignee: Multiprobe, Inc., Santa Barbara, CA (US)

( * ) Notice: Subject to any disclaimer, the term of this patent is extended or adjusted under 35 U.S.C. 154(b) by 88 days.

(21) Appl. No.: 13/341,777

(22) Filed: Dec. 30, 2011

(65) Prior Publication Data

US 2013/0168929 A1 Jul. 4, 2013

(51) Int. Cl.
 *B23B 31/30* (2006.01)
(52) U.S. Cl.
 USPC .................................. 279/3; 269/21; 414/941
(58) Field of Classification Search
 USPC ............ 279/3; 269/21; 414/941; 324/762.05; 438/14
 IPC ...................................................... B23B 31/30
 See application file for complete search history.

(56) References Cited

U.S. PATENT DOCUMENTS

| | | | | |
|---|---|---|---|---|
| 4,101,830 A | * | 7/1978 | Greig | 324/754.04 |
| 4,506,184 A | * | 3/1985 | Siddall | 310/328 |
| 5,564,682 A | * | 10/1996 | Tsuji | 269/21 |
| 5,708,222 A | * | 1/1998 | Yonezawa et al. | 73/865.8 |
| 5,739,050 A | * | 4/1998 | Farnworth | 438/15 |
| 5,883,932 A | * | 3/1999 | Chiba et al. | 378/34 |
| 6,268,740 B1 | * | 7/2001 | Iida | 324/750.19 |
| 6,388,733 B1 | * | 5/2002 | Hayashi | 355/53 |
| 6,437,868 B1 | * | 8/2002 | Coult et al. | 356/630 |
| 6,538,719 B1 | * | 3/2003 | Takahashi et al. | 355/53 |
| 6,596,115 B1 | * | 7/2003 | Menschig | 156/230 |
| 6,999,162 B1 | * | 2/2006 | Takahashi | 355/75 |
| 8,336,188 B2 | * | 12/2012 | Monteen et al. | 29/559 |
| 2004/0203178 A1 | * | 10/2004 | Lee et al. | 438/14 |
| 2010/0066395 A1 | * | 3/2010 | Johnson | 324/757 |

* cited by examiner

*Primary Examiner* — Eric A Gates
(74) *Attorney, Agent, or Firm* — Felix L. Fischer

(57) ABSTRACT

A semiconductor wafer processing tool has a support structure for a coarse motion positioning system. A measurement head having a rigid super structure is supported from the support structure by vibration isolators and a top plate is mounted to the super structure. A vacuum transfer chuck is releasably carried by the coarse motion positioning system and releasably adherable to the top plate by application of vacuum. The vacuum transfer chuck supports a semiconductor wafer.

8 Claims, 8 Drawing Sheets

SEMICONDUCTOR WAFER ISOLATED TRANSFER CHUCK

BACKGROUND INFORMATION

1. Field

Embodiments of the disclosure relate generally to the field of handling of semiconductor wafers for processing or testing and more particularly incorporate a chuck with a vacuum ring that can be vacuum adhered to the underside of a top plate for required operations and then released to a motion stage for repositioning.

2. Background

Handling and measuring of semiconductor wafers is accomplished by a class of tools known in the semiconductor fabrication industry. Such tools ordinarily have a chuck for holding the wafer, a motion stage to translate the wafer in x, y, z directions, and angularly rotate (referred to as theta rotation), and a supporting frame to hold a measurement instrument over the wafer. The measurement instruments can be optical as in the case of optical inspection equipment, acoustic, mechanical such as profilometers or scanned probe microscopes, or electrical as in the case of probers.

In each of these cases, it is critical to be able to move the wafer from location to location under the instrument. In most cases, the motion of the mechanical stage is difficult to stop in a precise and complete way. In the case of mechanical bearings common to each machine, the bearing will have some settling time and error associated with its motion. Furthermore, the larger the motion range, the greater will be the errors and settling time. Mechanical vibration also follows the same principle where the greater the motion range, the larger the vibration. Additionally, vibration has a spectral component where the larger the structure, the lower the frequency of vibration. Typically, lower frequency vibrations are worse because they are within the measurement frequency band and also have higher amplitudes sometimes referred to as 'pink' noise.

Probing or measuring instruments that work on wafers are plagued with vibration noise, settling time and drift during use on very small features present on the wafer. The instrument mounted to the frame of the tool is used to measure some small feature on a wafer but is suspended via a large mechanical loop and therefore is susceptible to these factors. In the case of a wafer measuring instrument, the thermally induced drift can be dominated by any sort of temperature instability. The frame and motion stage of the tool required to measure all parts of the wafer is somewhat more than twice size of the geometry being measured so that for a 300 mm wafer common in use today, the frame structure is typically on the order of 800 mm across, for the new 450 mm standard wafer, the frame will be more than 1000 mm. If the frame is made from steel components, the thermal expansion due to a 1 degree variation can be 800 mm times the coefficient of thermal expansion or 6 parts per million per degree or about 5 um per degree. Many measurements require sub micron accuracy and therefore, a large mechanical loop is highly undesirable.

It is therefore desirable to provide a system for suspending a measurement instrument and wafer holding fixture to uncouple from the mass and undesirable characteristic features of the larger tool while maintaining the ability to employ the mechanical systems of the tool for coarse position movement of the wafer.

SUMMARY

Embodiments described herein disclose a semiconductor wafer processing tool having a support structure for a coarse motion positioning system. A measurement head having a rigid super structure is supported from the support structure by vibration isolators and a top plate is mounted to the super structure. A vacuum transfer chuck is releasably carried by the coarse motion positioning system and releasably adherable to the top plate by application of vacuum with the vacuum transfer chuck supporting a semiconductor wafer. A kinematic alignment mechanism may be engaged during the chuck transfer operation to enhance positional accuracy during the transfer.

The features, functions, and advantages that have been discussed can be achieved independently in various embodiments of the present invention or may be combined in yet other embodiments farther details of which can be seen with reference to the following description and drawings.

DETAILED DESCRIPTION

The embodiments described herein provide a special vacuum transfer chuck to cycle between the coarse motion positioning system of a wafer processing tool and a resiliently mounted measurement head for rigidity while the measurement is taking place but still allowing the wafer to be moved freely over large distances. An example tool in which the present embodiment may be employed is a Tokyo Electron Limited Tel P12 XLn Wafer Prober though many other designs of coarse positioning may benefit and be configured with the present invention. The desired capability is accomplished by placing the wafer inside a chuck with a vacuum ring that can be vacuum adhered to the underside of a top plate incorporated in the measurement head when measuring and then released to the motion stage for repositioning. While the vacuum transfer chuck is engaged to the top plate, its mechanical loop is very small compared to the entire wafer prober stage and frame technology and the entire structure is thermally stable relative to itself due to the strong coupling between the chuck and plate. Furthermore, the mechanical stage does not touch the transfer chuck during measurements and therefore, noise vibration from the mechanical stage and tool as a whole does not create problems for the measurement. The top plate is also decoupled from noise in the mechanical frame through use of a vibration isolation system between the top plate and the frame. Such isolation systems and their characteristics are well known in the art.

Figure 1:
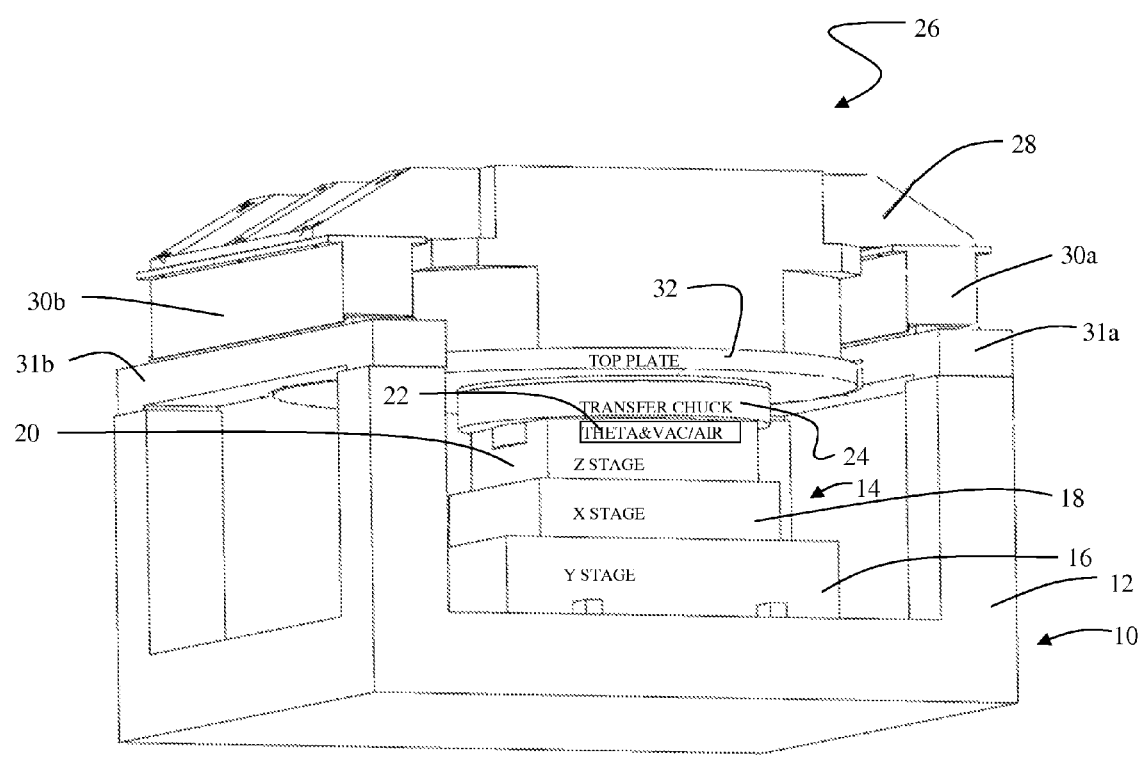
FIG. 1 is an isometric view of an example wafer processing tool having coarse positioning stages with an embodiment of the isolated measurement head and associated vacuum transfer chuck system.
Figure 2:
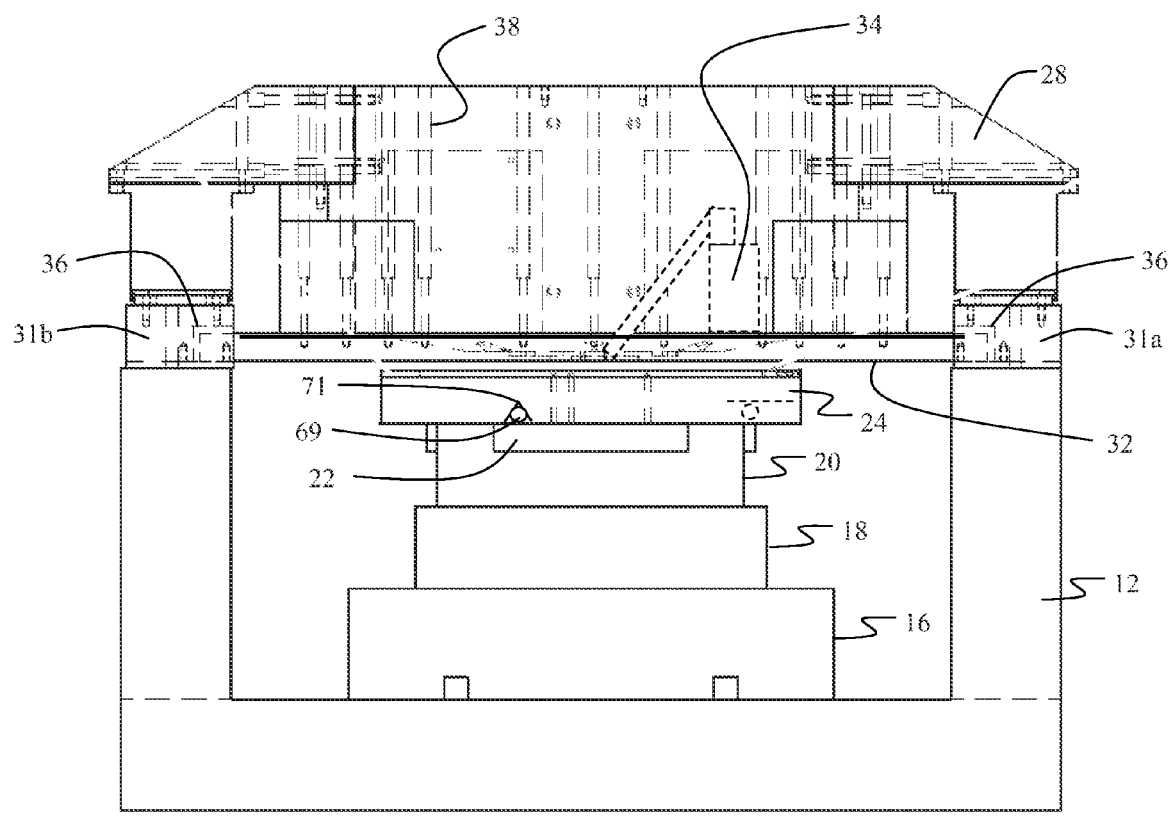
FIG. 2 is a side view of the tool of FIG. 1 with the transfer chuck decoupled from the top plate of the measurement head.

Referring to FIGS. 1 and 2, wafer processing or metrology tool 10 incorporates a support structure 12 for a coarse motion positioning system 14 which includes a Y stage table 16, and X stage table 18 and a Z stage actuator 20. The Y stage table and X stage table provide orthogonal lateral translation in the X-Y plane while the Z stage actuator provides vertical motion in the perpendicular z-axis. A rotation table 22 is mounted in the Z axis table for theta rotation. The motion positioning system provides 3-axis motion plus theta rotation for a vacuum transfer chuck 24 for coarse positioning under a measurement head 26.

Measurement head 26 incorporates a rigid super structure 28 which is supported from the tool support structure 12 by vibration isolators 30a and 30b, which are mounted to support structure 12 with spacer blocks 31a and 31b respectively. While shown as opposing mounting structures for the embodiment of the drawings, those skilled in the art will recognize alternative mounting isolation systems for alternative embodiments. A top plate 32 is mounted to the super structure 28 over the motion positioning system.

Figure 3A:
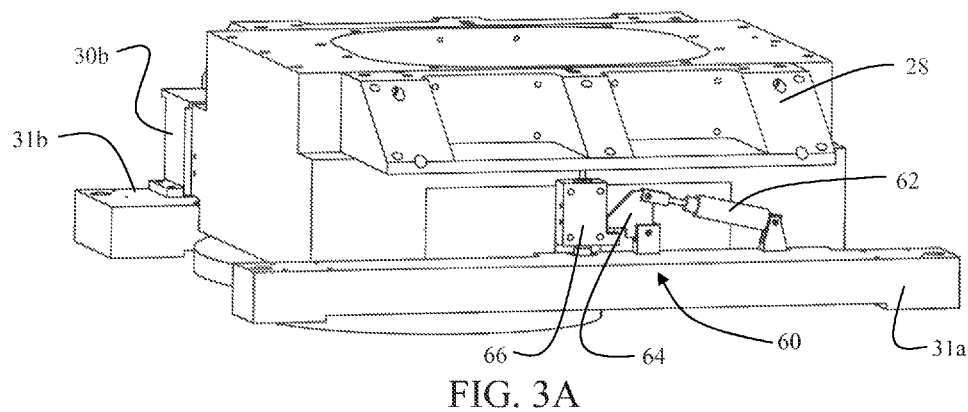
FIGS. 3A and 3B are detailed partial side section views of the kinematic alignment stage.
Figure 3B:
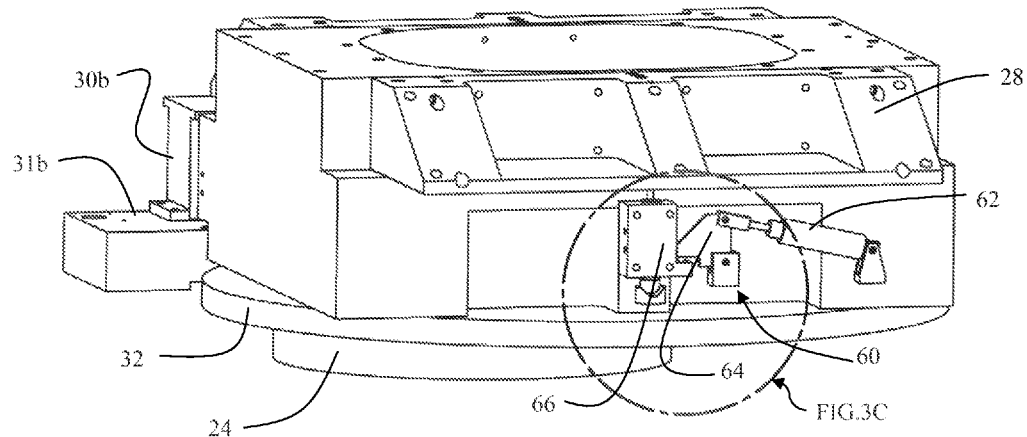
Figure 3C:
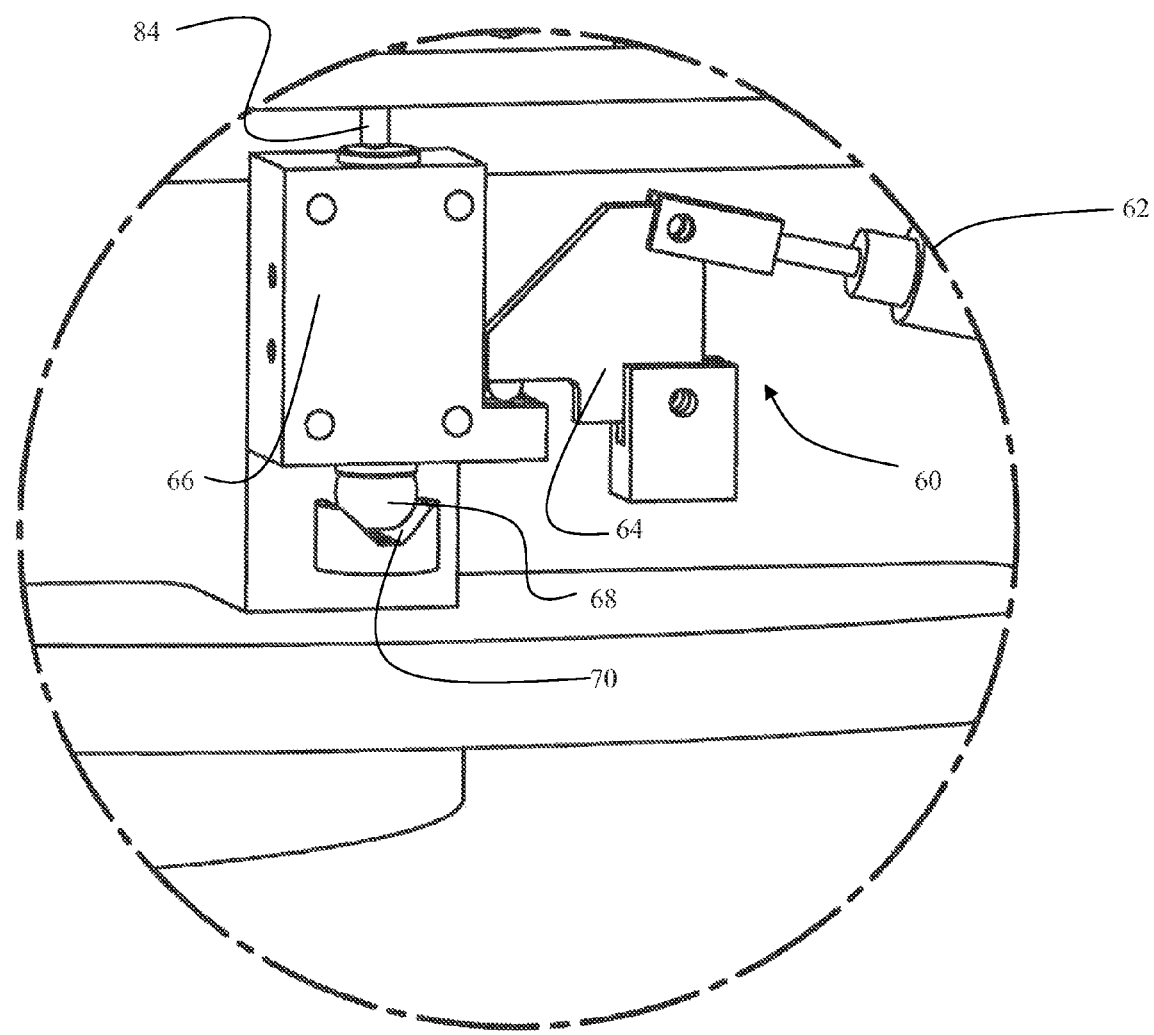
FIG. 3C is a detailed view of the kinematic positioning elements.
Figure 4:
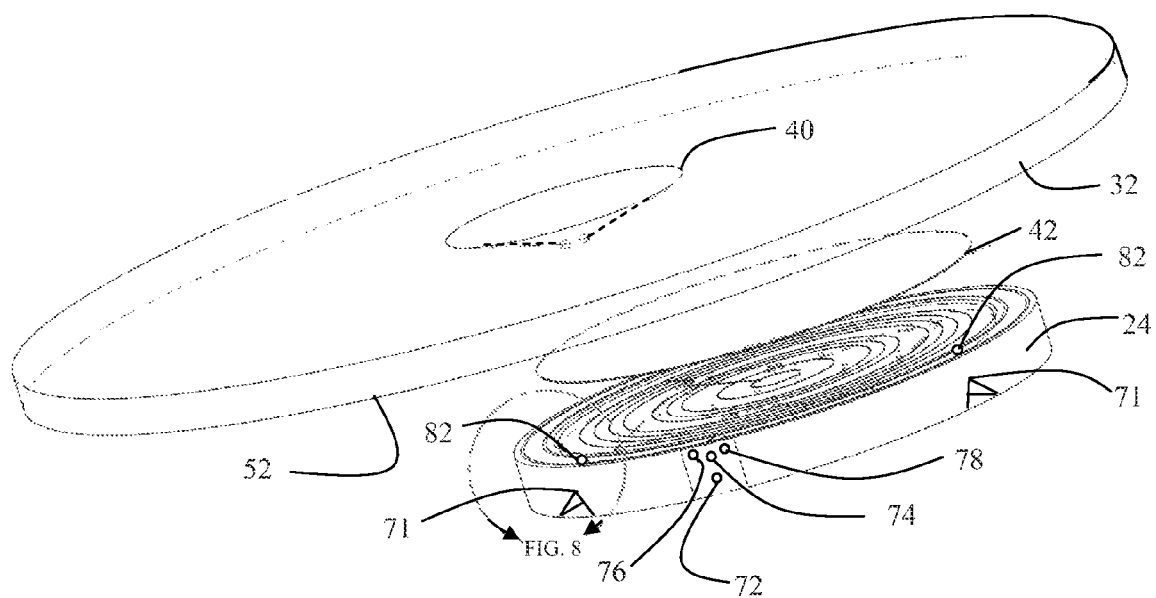
FIG. 4 is an exploded isometric view of the top plate, wafer and vacuum transfer chuck.
Figure 6:
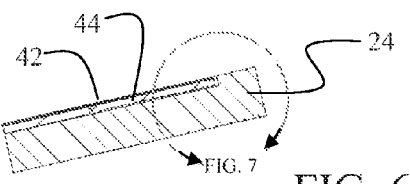
FIG. 6 is a partial side section view of the vacuum transfer chuck along line 6-6 of FIG. 5.

Shown in FIG. 3A, with vibration isolator 30a removed for clarity, are a set of three ball and slot kinematic positioning elements 60 each with one or more air actuation cylinders 62. During transfer of the vacuum transfer chuck 24 in the exemplary embodiment, the kinematic positioning elements are engaged in order to rigidly align the structure 28 relative to the tool frame 12. By extension of air actuation cylinders 62, rockers 61 pivot to depress supports 66 which are rigidly attached, to the superstructure 28. This compresses vibration isolators 30a and 30b to rigidly engage kinematic balls 68 into respective slots 70, as seen in FIG. 3B with the spacer block 31a also removed for clarity. FIG. 3C shows the kinematic positioning elements in detail. Use of a three point ball and slot arrangement allows the kinematic stage to constrain the superstructure to substantially the same xy and, z position within one or a few microns. Kinematic stages are well known in the art. The chuck may also have a kinematic transfer stage employing ball and slot kinematic positioning elements with kinematic balls 69 and respective slots 71 (as shown in FIG. 2 and, subsequently discussed with respect to FIGS. 4 and 5) to register the chuck to the same position each time a transfer is made.

A measurement tool such as an Atomic Force Microscopy (AFM) head 34 is mounted on the top plate 32 or in/on the super structure 28 for measurement of a supported wafer as will be described in greater detail subsequently. Alternative tools such as Atomic Force Prober (AFP) Nanoprobers, high resolution probers or optical inspection tools may be employed.

For the embodiment shown, top plate 32 extends into lateral reliefs 36 in the spacer blocks 31a and 31b of the tool support structure 12, as shown in FIG. 2. The top plate is secured to the super structure 28 with a plurality of bolts, inserted through bores 38 for the embodiment shown. The assembly of the top plate to the support super structure is done with blind holes from above to leave a flat, smooth underside vacuum surface.

Figure 5:
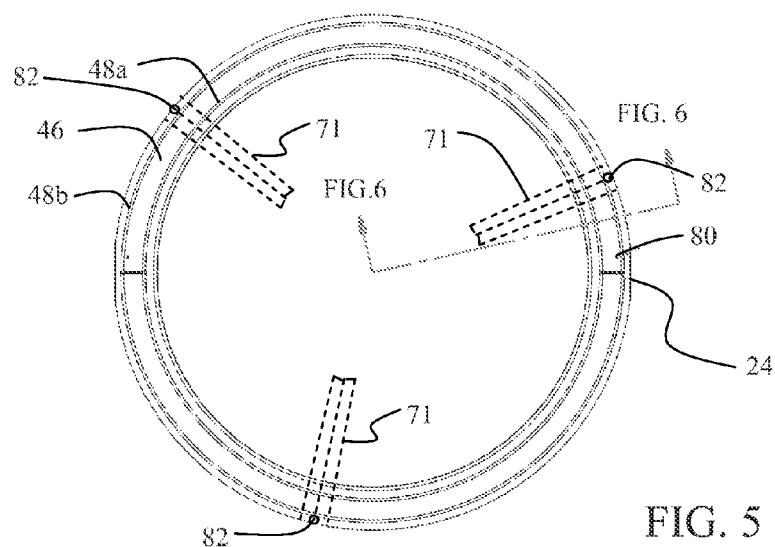
FIG. 5 is a top view of the vacuum transfer chuck.

As shown in FIG. 1, the top plate 32 incorporates an aperture, in the embodiment shown conical aperture 40, for access to the wafer 42 by the AFM or other tool head. Vacuum transfer chuck 24 supports wafer 42 on a wafer chuck 44, best seen in FIGS. 5, 6, 7 and 8, and includes a vacuum ring surface 46 surrounded by inner and outer vacuum grooves 48a and 48b. The wafer chuck is inset in a relief 50 in a top surface of the vacuum transfer chuck for clearance of the wafer below the interface between the vacuum ring surface and top plate. The vacuum transfer chuck is releasably adhered to bottom surface 52 of the top plate 32 by closely positioning the vacuum transfer chuck adjacent the bottom surface and drawing vacuum in the vacuum grooves 48a, 48b, as will be described in greater detail subsequently. As previously described, kinematic positioning of the chuck is accomplished with three slots 71 radially extending at 120° intervals as shown in FIG. 5. The wafer chuck 44 may provide fine translational positioning of the wafer through piezoelectric actuation or other actuation system. The wafer may be fine positioned microns or hundreds of microns depending upon the design of the piezoelectric stage. Such a stage may be used for also for scanning of the wafer. Wafer chuck 44 will preferably be electrically isolated and guarded from the chuck to allow separate biasing and current collecting as is well known in the art of probing.

Figure 7:
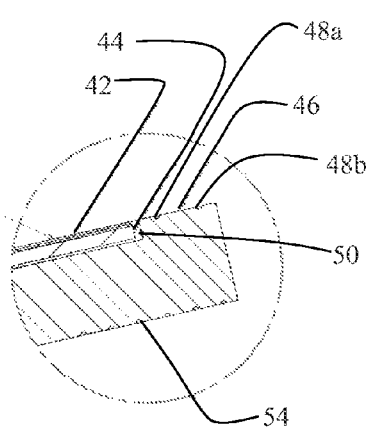
FIG. 7 is a detailed side section view of the vacuum transfer chuck showing the wafer chuck and vacuum ring structure.

As shown in FIG. 7, the vacuum transfer chuck 24 incorporates a vacuum and air interface provided by circular grooves 54 in a bottom surface of the vacuum transfer chuck which are employed for vacuum adherence of the vacuum transfer chuck to a top surface of the rotation table 22 allowing secure support for the vacuum transfer chuck during translational motion by the coarse motion positioning system 14. Providing positive air pressure in the grooves 54 allows transfer of the chuck from the stage and may be used to align the top surface of vacuum chuck 24 to bottom surface 52 in a substantially frictionless manner. This may be used to soften the transfer of vacuum transfer chuck 24 from support of the vacuum transfer chuck by the motion positioning system coarse motion positioning system 14 to top plate 32.

Returning to FIG. 4, a vacuum port 72 is provided on the vacuum transfer chuck 24 and interconnected through machined conduits and channeling to inner and outer vacuum grooves 48a, 48b for connection to a vacuum source. An air/vacuum transfer port 74 is also provide and interconnected through machined conduits and channeling to grooves 54. Inert gas purging of the wafer may be provided by a purge port 76 interconnected through machined conduits and channeling in the vacuum transfer chuck.

Vertical positioning of the vacuum transfer chuck 24 to the top plate 32 is done in the example embodiment through means of repeatable action of the positioning system 14. Ideally, the accuracy, repeatability, and reproducibility of such systems are sufficient for safe transfer. Closed loop positioning stages are repeatable to <2 um and may not require detection of surface proximity but non-closed loop systems with lower accuracy require sensing of proximity and contact. Example embodiments have demonstrated proximity sensing is an important element of the disclosed system and it acts as an important indicator upon which to control the approach of the chuck to the interface top plate and can be used in software to automate that motion. Furthermore, as described below, the planarity of the chuck and top plate is critical to accurate transfer. The proximity sensors are useful in initial tool leveling and also active planarization as discussed below.

Vertical position sensing during transfer of the vacuum transfer chuck from the coarse motion positioning system to vacuum adherence to the top plate is accomplished with a fine position sensor which in the embodiment shown uses an air gage system having a port 78 interconnected with at least one orifice 80 in the vacuum ring surface 46 as best seen in FIG.

5. Air gage systems are well known in the art and further embodiments of contact sensing may comprise electrical contact sensing by means of pogo pins or by via capacitive proximity sensing, magnetic or optical sensing.

It may be preferable to allow adjustment of the leveling of the chuck vacuum ring to the plate. For the embodiment shown in FIGS. 4 and 5, three position sensors 82 are disposed in the chuck vacuum ring substantially along the radial angles used for the kinematic positioning slots 71. The chuck is brought to a height whereby the proximity sensors measure the height to the plate. If a difference is registered between the sensors, the top plate and chuck are planarized relative to each other. This can be accomplished in an embodiment where actuation under either the ball or slot in the Kinematic positioning elements with at least two of the kinematic ball/slot mechanisms as described with respect to FIGS. 3A-3C being actively vertically positioned with a vertical adjustment element 84 as shown in FIG. 3C. The actuation may be preferably done by means of a piezo stack. Either the vacuum chuck or the top plate may be actuated.

Figure 8:
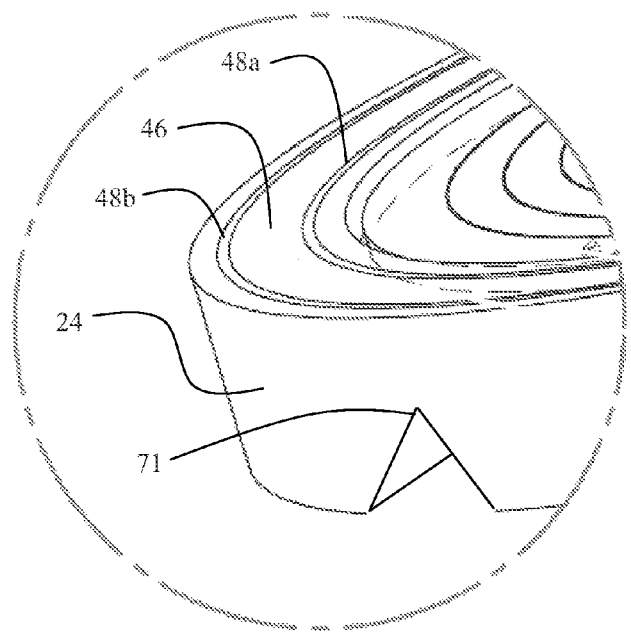
FIG. 8 is a detailed partial isometric view of the vacuum transfer chuck showing the wafer chuck and vacuum ring structure.
Figure 9A:
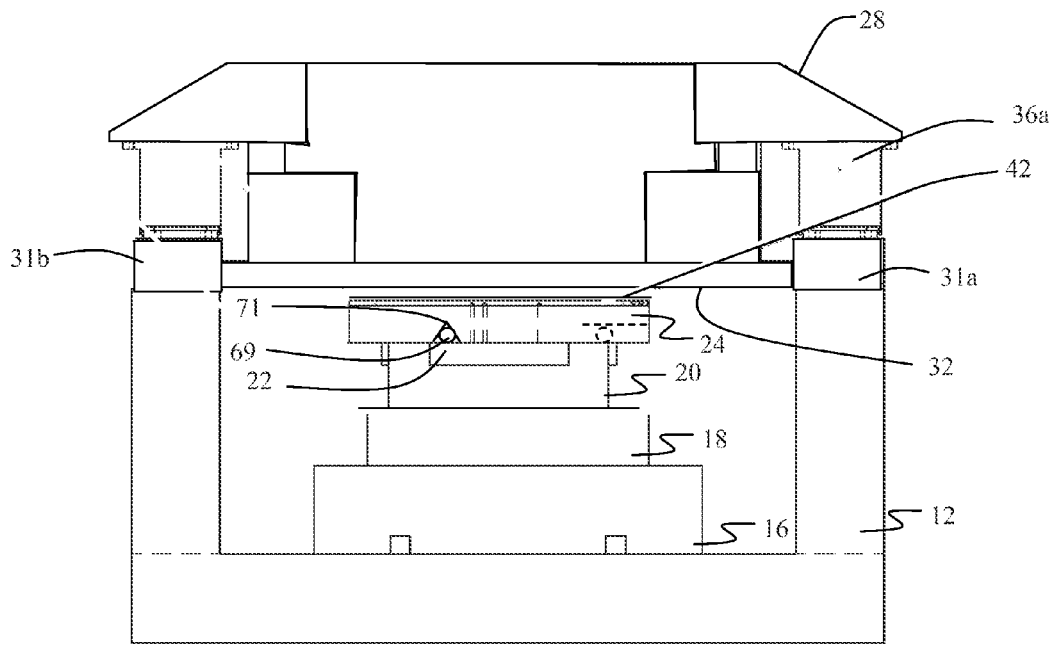
FIGS. 9A and 9B are detailed partial side section views of the vacuum transfer chuck, top plate and motion positioning system in the adhered and released positions; and, FIGS. 10A and 10B are detailed partial isometric section views of an alternative kinematic positioning system for the vacuum transfer chuck.

FIGS. 3A-C show a kinematic positioning system of the three ball and three radial slot design often favored in systems where thermal expansion and contraction as well as heavy loads are an issue. Because the slots are radial, if expansion is created, the center of the top plate 32 can remain stationary as all of the balls expand radially in the slots. The construction of the kinematic design shown in FIGS. 3A-3C is actuated in the super structure 28 supporting the top plate 32. FIGS. 2, 8 and 9A, as previously described, show a similar style kinematic registration slot under the vacuum chuck to allow precise registration of the vacuum chuck to the XYZTheta mechanical stage 14 during and after transfer of the vacuum chuck 24. Without the registration, the chuck transfer can be imprecise or may walk with successive transfers. Therefore, in the preferred embodiment of the invention some form of registration should hold the system fixed during transfer for maximum accuracy.

Figure 10A:
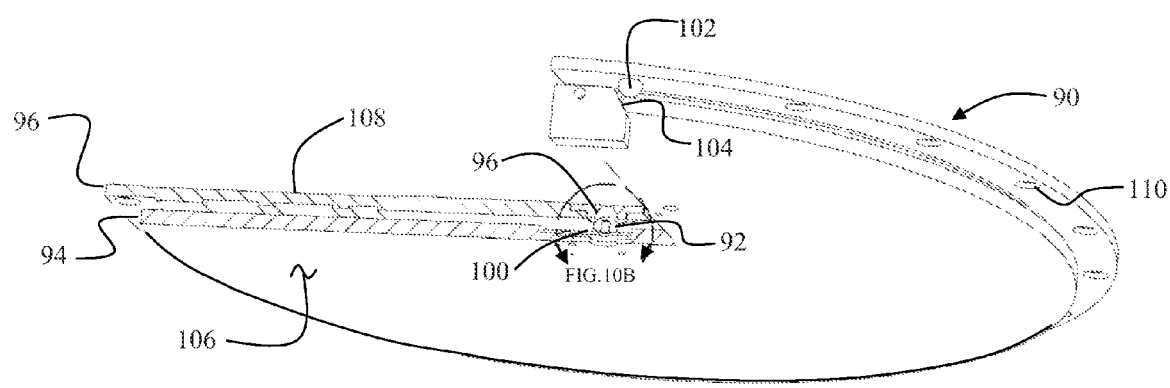
Figure 10B:
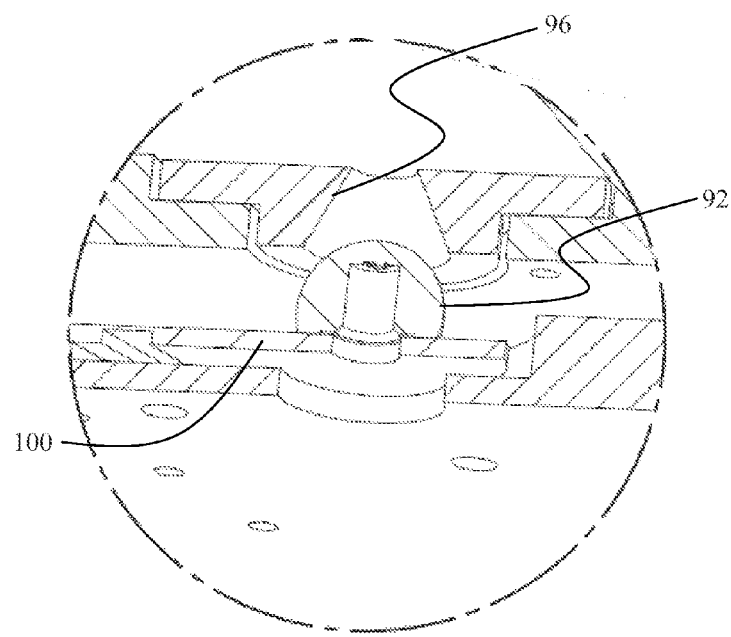

FIGS. 10A and 10B show a detailed embodiment of a kinematic registration stage 90 adapted to fit within the constrained spaces in a commercially available probe station such as the Tokyo Electron P12XLn. The design and its literature are well known in the art as exemplary in the art of such stations. Other probing stations are possible to use from various commercial vendors or through original construction. The kinematic registration design shown uses cylindrical coordinates as is known in the art. A ball 92 in a lower plate 94 registers to a cone 96 in an upper plate 98 constraining the radial or "R" dimension. The ball is attached via a flexure 100 to allow it to move vertically but without motion in X or Y. The flat vacuum and air plate constrains the "Z" dimension of the upper plate 98 relative to the lower plate 94 and an external ball 102 registers against a bevel 104 to provide a rotational or "Theta" constraint. Such stages are well known in the art but have not to our knowledge been used in probers because no transfer has been previously envisioned. A bottom face 106 of the lower plate 94 also serves as the top of the coarse positioning system rotational stage 22. An upper face 108 of the upper plate 98 serves as the base of the vacuum chuck 24. Mounting holes 110 are shown at the periphery of the upper plate that serve to secure it to the vacuum chuck. The combination of upper and lower kinematics provide for transfer accuracies and repeatabilities below one micron in practice.

Figure 9B:
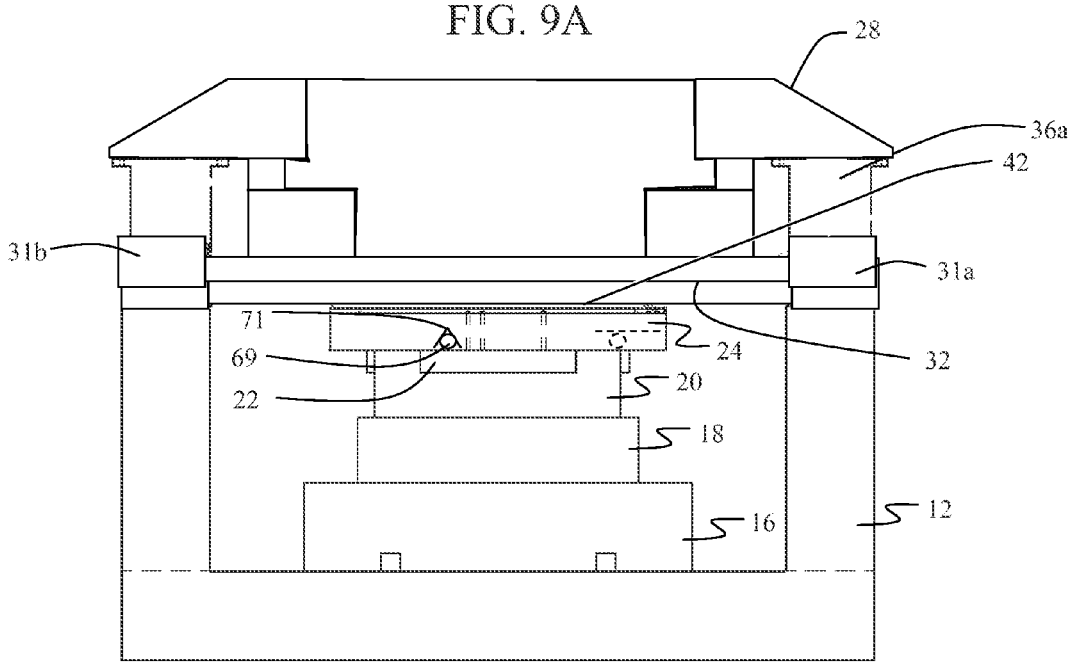

Operation of a system employing the embodiment disclosed is accomplished by initial positioning of wafer with the vacuum transfer chuck 24 resting on the coarse positioning system 14 as shown in FIG. 9A. The vacuum transfer chuck maybe releasably adhered to the coarse positioning system by drawing vacuum on the air/vacuum port 58. The coarse positioning system 14 is employed to position the vacuum transfer chuck and wafer in a desired X-Y location with desired theta rotation. The Z axis stage is then employed to lift the vacuum transfer chuck into close proximity to the bottom surface 52 of top plate 32. The air gage operable through air gage port 62 registers an increase in pressure as the vacuum ring surface 46 comes into close proximity to the bottom surface 52. The vacuum is then released from air/vacuum port 58, and in certain operational scenarios, slight air pressure provided through air/vacuum port 58 to release the vacuum transfer chuck from the coarse positioning system 14. Vacuum is then applied to the vacuum port 56 in the vacuum transfer chuck drawing the chuck against and releasably adhering it to the bottom surface 52 of the top plate 32 and lifting the vacuum transfer chuck from the coarse positioning system 14 as shown in FIG. 9B. Fine lateral translation of the wafer may then be accomplished using the wafer chuck 44 and measurements made using the AFM probe accessing the wafer through the conical aperture 40.

With the vacuum transfer chuck 24 adhered to the top plate, the entire measurement head 26 is isolated from the remainder of the tool by vibration isolators 30a, 30b providing the desired small mechanical loop and the entire structure is thermally stable relative to itself due to the strong coupling between the chuck and plate. The mechanical stage does not touch the vacuum transfer chuck during measurements and, therefore, noise vibration from the mechanical stage and tool as a whole does not reach the measurement head and its associated tools. Scanning or other measurements can then be accomplished by the AFM head.

When measurements are complete, vacuum on vacuum port 56 is released allowing the vacuum transfer chuck 14 to return to support on the coarse positioning system 14. Vacuum may then be reestablished on air/vacuum port 58 to secure the chuck for additional positioning or other operations.

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A system for isolation of a semiconductor wafer test tool comprising:
    a measurement head having a rigid super structure which is supported from a tool support structure by vibration isolators, said super structure further having kinematic positioning elements;
    a top plate mounted to the super structure having an underside vacuum surface;
    a vacuum transfer chuck having a vacuum ring surface releasably adherable to the top plate underside vacuum surface by application of vacuum, said vacuum transfer chuck supporting a semiconductor wafer.

2. The system for isolation of a semiconductor wafer test tool as defined in claim 1 wherein the vacuum ring surface is surrounded by inner and outer vacuum grooves, said vacuum ring surface adhering to the top plate upon application of vacuum to the vacuum grooves.

3. The system for isolation of a semiconductor wafer test tool as defined in claim 2 wherein the vacuum transfer chuck further incorporates a wafer chuck supported in a recess for clearance from the top plate with the vacuum ring surface in contact with the top plate.

4. The system for isolation of a semiconductor wafer test tool as defined in claim 3 wherein the wafer chuck is positionable with piezoelectric actuation and wherein said actuation may provide X-Y scanning.

5. The system for isolation of a semiconductor wafer test tool as defined in claim 2 further comprising a vacuum port in the vacuum transfer chuck interconnected to the vacuum grooves.

6. The system for isolation of a semiconductor wafer test tool as defined in claim 2 further comprising a vertical fine positioning sensor on the vacuum ring surface.

7. The system for isolation of a semiconductor wafer test tool as defined in claim 6 wherein the vertical fine positioning sensor is selected from the set of at least one air gage port in the vacuum transfer chuck interconnected to an orifice on the vacuum ring surface, at least one capacitance proximity sensor, at least one electrical contact proximity sensor, at least one piezo electric pressure sensor, at least one eddy current sensor, or at least one magnetic proximity sensor.

8. The system for isolation of a semiconductor wafer test tool as defined in claim 1 wherein the top plate incorporates an aperture for access by a test measurement tool to the wafer supported by the vacuum transfer chuck.

\* \* \* \* \*